United States Patent [19]

Tamura et al.

[11] Patent Number: 4,923,352

[45] Date of Patent: May 8, 1990

[54] SYSTEM FOR MANUFACTURING SEMICONDUCTOR UNDER CLEAN CONDITION

[75] Inventors: Takumi Tamura; Shosuke Shinoda; Tetsuo Yamashita; Kyohiko Okashita, all of Tateyama, Japan

[73] Assignee: Kabushiki Kaisha N.M.B. Semiconductor, Chiba, Japan

[21] Appl. No.: 291,757

[22] Filed: Dec. 29, 1988

[30] Foreign Application Priority Data

Mar. 31, 1988 [JP] Japan .................................. 63-78485

[51] Int. Cl.⁵ .............................................. B65H 5/08
[52] U.S. Cl. .................................. 414/225; 98/115.3; 98/31.5; 29/722
[58] Field of Search ............... 414/225, 226, 222, 217, 414/231, 939, 940; 98/115.3, 31.5; 29/722

[56] References Cited

U.S. PATENT DOCUMENTS 3,944,405  3/1976  Calsteren .................. 98/115.3 X
4,660,464  4/1987  Tanaka ....................... 98/115.3
4,674,181  6/1987  Hamada et al. ............. 414/226 X
4,699,640  10/1987 Suzuki et al. ................ 98/115.3 X
4,787,297  11/1988 Johnson .......................... 98/115.3

Primary Examiner—Robert J. Spar
Assistant Examiner—Donald W. Underwood
Attorney, Agent, or Firm—Oliff & Berridge

[57] ABSTRACT

In semiconductor production plants a highly clean state is required. In a plant building, through which air is forcibly circulated, a clean room in a low or medium cleanliness state is formed using a filter. A plurality of processing units are provided in the clean room and held in a high cleanliness state. A transport robot transfers a workpiece or like object to and from each processing unit. The robot is capable of being driven to positions corresponding to the processing units and holds the workpiece or object in a highly clean state. Thus, there is no need of holding the entire building highly clean, and only a required part of the building may be held in a highly clean state, which is advantageous from the standpoint of cost.

4 Claims, 6 Drawing Sheets

SYSTEM FOR MANUFACTURING SEMICONDUCTOR UNDER CLEAN CONDITION

BACKGROUND OF THE INVENTION

The present invention relates to a system for manufacturing semiconductor under a clean condition, which can be suitably implemented in a semiconductor production plant or the like requiring high degree of freedom from dust.

In semiconductor production plants, it has become essential to provide a dust-free (or ultra-clean) manufacturing condition with increase of integration density of products and increase of fineness of processing. Equipment for providing clean condition of semiconductor production plants thus is important. A system for providing a clean condition which is called an entire downflow system has heretofore been employed most extensively. In this system, air having passed through a fine dust particle removal filter is caused to flow down through a room so that air in the room is cleaned with this circulation of clean air.

In this system, a large quantity of expensive filters are used to cause circulation of clean air through the entire room. Therefore, high cost is required to provide an increased cleanliness. In addition, the scale of air suction fan is inevitably increased. Furthermore, an upper limit is imposed on the cleanliness, and it is difficult to realize as high cleanliness as class 10 or below. This problem is particularly serious in semiconductor production plants for manufacturing high integration density products such as ultra LSIs or ultra ultra LSIs. For this reason, it has been proposed and practiced to provide a so-called clean tunnel in a transport section to partition the manufacturing section with respect to the other sections. In this case, however, high equipment cost is required. In addition, the borderline of cleanliness is provided only by the clean tunnel. Therefore, expected effect of providing cleanliness can not be obtained.

SUMMARY OF THE INVENTION

An object of the invention is to provide a system for manufacturing semiconductor under clean condition, which is advantageous costwise, permits a highly clean state to be obtained and does not require any large-scale withdrawal fan.

To attain the above object of the invention, there is provided a system for manufacturing semiconductor under clean condition, which comprises a plurality of processing units disposed in a clean room in a low or medium cleanliness state and held in a high cleanliness state, and a transport robot capable of being driven to positions corresponding to the plurality of processing units and having a self-cleaning function of holding clean a transfer box, in which a workpiece or an object is accommodated, the transport robot being controlled such as to effect transfer of the workpiece or object between its arm and a processing unit when it reaches the position corresponding to the processing unit.

The processing units (and storage stockers, if necessary) are locally held in a highly clean state at all time, and also the transport robot, which transfers a workpiece or object to and from the processing unit (or storage stocker) is locally held in a highly clean state.

The transport robot need not have a self-cleaning function so long as it can hold an object which is accommodated in a carrier in a sealed state in a highly clean state outside the clean room.

The highly clean state may be formed by partitioning the clean room with a partitioning wall, or alternatively, each processing unit may be held in a highly clean state by providing its housing with a filter.

The cleanliness may be varied by varying the mesh of the filter provided on the ceiling of the clean room.

DESCRIPTION OF THE PREFERRED EMBODIMENT

Figure 1:
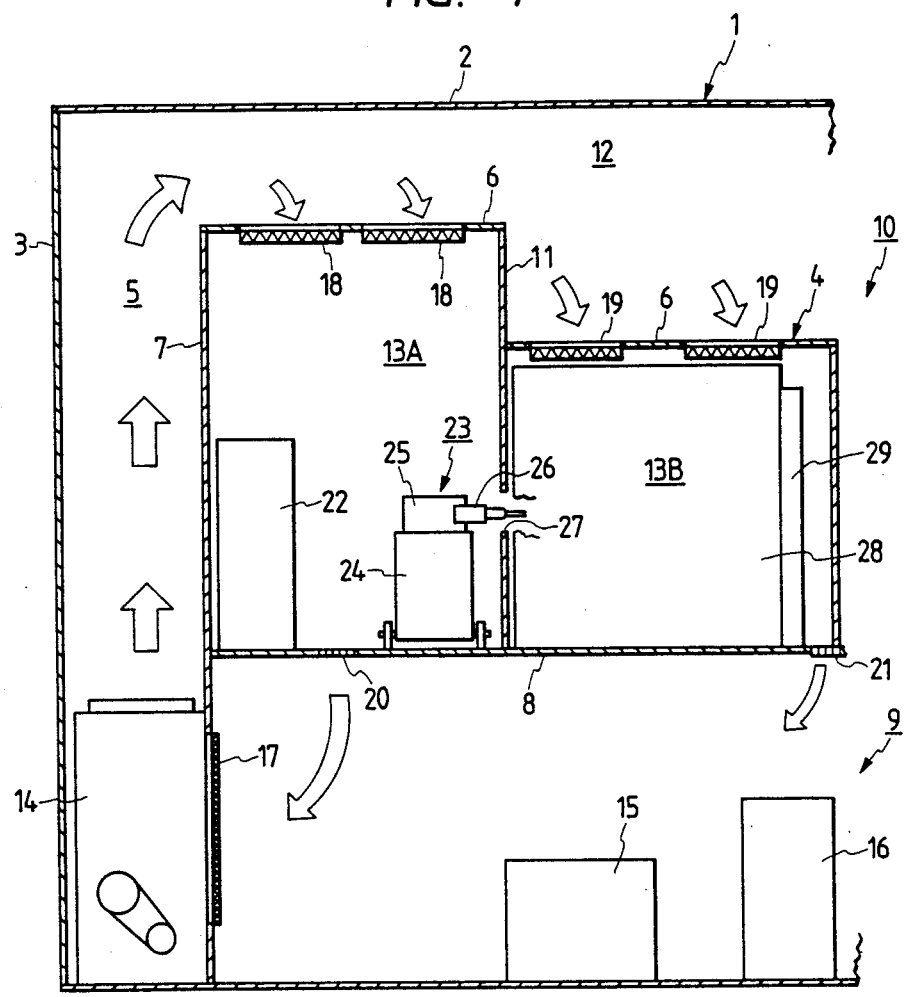
FIG. 1 is a schematic sectional view showing an embodiment of the invention.

FIG. 1 is a schematic view showing the entire system according to the invention. Reference numeral 1 designates outer walls of a building. The outer walls 1 include a ceiling 2 and a side wall 3. Reference numeral 4 designates inner walls provided on the inner side of and at a suitable distance from the outer walls 1 to form a clean room 12. A room 5 is formed between the inner and outer walls 4 and 1. The inner walls 4 include a ceiling 6, a side wall 7 and a bottom 8. The bottom 8 partitions the interior of the building into first and second story parts 9 and 10. A vertical partition wall 11 is provided between the ceiling 6 and bottom 8 to divide the clean room 12 into two rooms 13A and 13B having different cleanlinesses.

In the building having above structure, a fan 14 is disposed in the first story part of the room 5, and a power source unit 15 and a control panel 16 for controlling the supply of gases and liquid chemicals are provided on the inner side of the side wall 7 in the same story part. A filter 17 is provided in a portion of the side wall 7 in front of the fan 14 to remove dust from air caused to flow from the first story part toward the fan 14. Filters 18 and 19 having different mesh sizes are provided in the ceiling 6 on the opposite sides of the partitioning wall 11. The bottom 8 is provided with holes or openings 20 and 21. Air entering the rooms 13A and 13B from the filters 18 and 19 is returned to the first story part 9 through the holes 20 and 21, thus holding cleanliness of air in each room. While the cleanliness of the room 5 is about class 1,000, the cleanliness of the room 13A is about class 300, and the cleanliness of the room 13B, in which a storage stocker 28 and a processing unit 29 are disposed, is class 1.

The room 13A serves as an operation area with control unit 22 disposed therein. A transport robot 23 can run inside the room 13A. The robot 23 has a body 24 and a head 25 rotatably provided on top of the body 24 and is capable of accommodating an object 31 (not shown) to be transported. The head 25 has an arm 26 for clamping and unclamping the object (i.e., a carrier accommodating semiconductor wafers) 31. The arm 26 can penetrate a hole provided in the partition wall 11 for feeding the object 31 in and out of the storage stocker 28 and processing unit 29 provided in a juxtaposed fashion in the room 13B.

Figure 2:
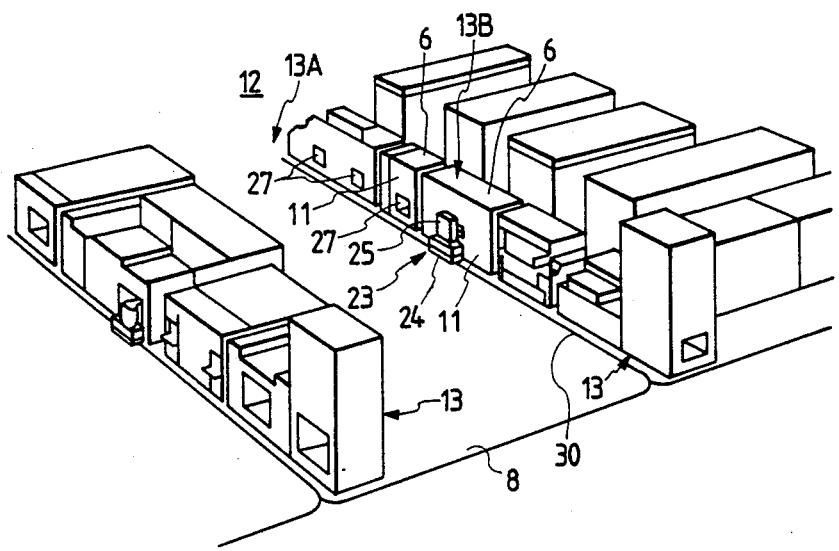
FIG. 2 is a perspective view showing an arrangement of a plurality of structures shown in FIG. 1.

FIG. 2 is an actual arrangement of a plurality of the structures shown in FIG. 1. The entirety shown in this Figure constitutes clean room 12. In this room 12, rooms 13B are formed by partitioning walls and ceiling 6. Guideways 30 are laid on the floor 8. Where the robot 23 is wheeled such as a railway wagon, rails are laid as the guideways 30 on the floor 8. Where the robot 23 is driven by electromagnetic induction, wires or tape-like members, through which AC current can flow, are laid. The robot 23 is guided mechanically or by electromagnetic induction along the guideways 30 to run a predetermined course to a position in front of each room 13B.

Figure 3:
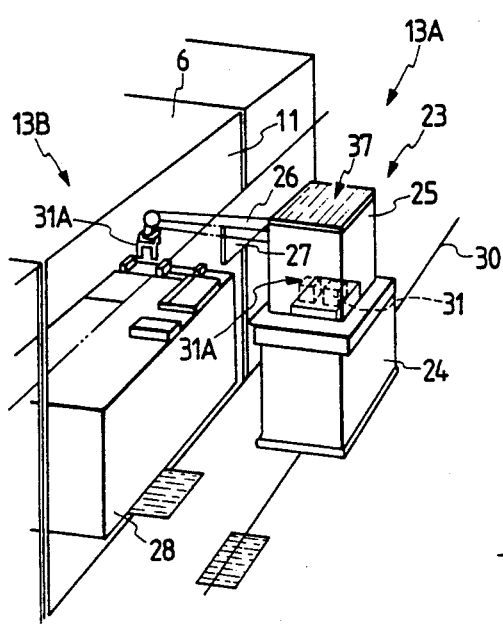
FIG. 3 is a perspective view showing a robot of a transport robot extending into the inner side of a partitioning wall.

FIG. 3 shows the robot 23 held in front of a room 13B for in- or out-feeding the object 31. The robot 23 shown in FIG. 3, has a carrier 31A, in which the workpiece 31 is sealed in a highly clean state, and is accommodated in the head outside the clean room 12. The head 25 of the robot 23 held in front of the room 13B is turned to bring the arm 26 to a position directed toward the partitioning wall 11, and in this state the arm 26 is inserted into the room 13B through the hole 27 in the partitioning wall 11. In its state extending into the room 13B, the arm 26 transports the carrier 31A to the storage stocker 28 or processing unit 29. Therefore, the arm has a telescopic structure, can be raised and lowered in unison with the head 25 and can be turned in a vertical plane about its portion supported by the head 25.

Figure 4:
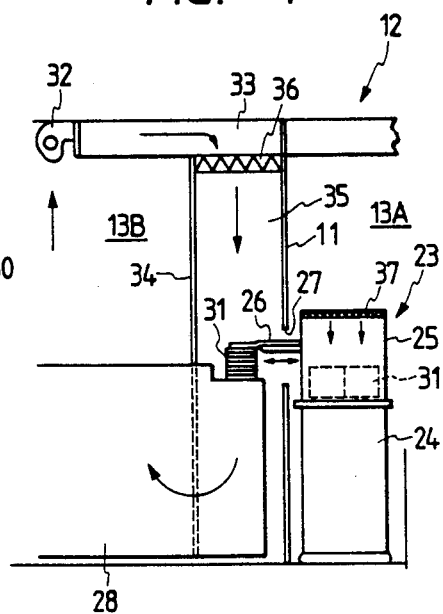
FIG. 4 is a sectional view showing a modification of a portion of the embodiment of the system corresponding to a central portion shown in FIG. 3.

FIG. 4 shows a modification of the system described above according to the invention. In this instance, the partitioning wall has a double-wall structure, and the transport robot 23 has a self-cleaning function. More specifically, a fan unit 32 and a duct 33 are provided on top of a room 13B, and another partitioning wall 34 is provided on the inner side of partitioning wall 11. A room 35 defined between the two partitioning walls 11 and 34 is communicated with the room 13B through vent holes formed in the partitioning wall 34. A filter 36 is provided in an upper portion of the room 35, and air in the room 13B is circulated through the filter 36 as shown by arrow in the Figure. A filter 37 is provided on the head 25 of the robot 23. This filter 37A withdraws air in the room 13A and provides it to the inside of the head 25 after dust removal. The transport of the object 31 in or out of the storage stocker 28 or processing unit 29 is performed in such a highly clean environment as noted above. In this case, air is supplied to the room 35 by the fan 32, and no air enters the room 13B from the room 13A through the hole 27 in the partitioning wall 11.

In the dust-free transport system having the construction as described above, the transport robot 23 holding the object in a highly clean state is run along the guideways 30 laid in the room 13A. When the robot 23 is brought to a position in front of a storage stocker 28 or a processing unit 29, it is stopped, and the arm 26 is operated. Where the robot 23 has a self-cleaning function, it transports the object 31 to or out of the storage stocker 28 or processing unit 29. Where the robot has no self-cleaning function, it transports a carrier accommodating the object in or out of the storage stocker 28 or processing unit 29. The timing of start and direction of running of the robot 23 and timing of the start of operation of the arm 26 are controlled by a computer. The object 31 is transported through a clean space by a dust-free unit or carrier mounted in the robot 23. Therefore, the cleanliness of the entire plant with the guideways 30 laid therein may be of the order of class 10,000.

Now, a modification of the transport robot will be described.

Figure 5:
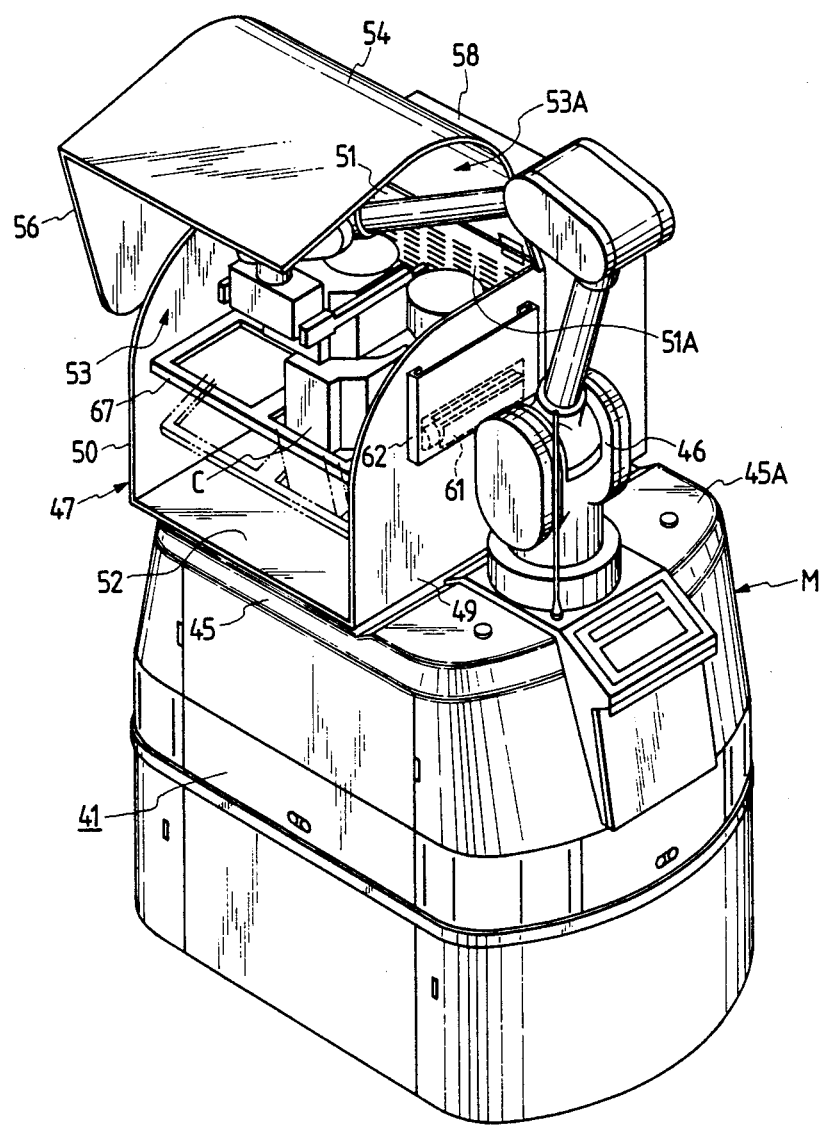
FIG. 5 is a perspective view showing a modified transport robot.
Figure 7:
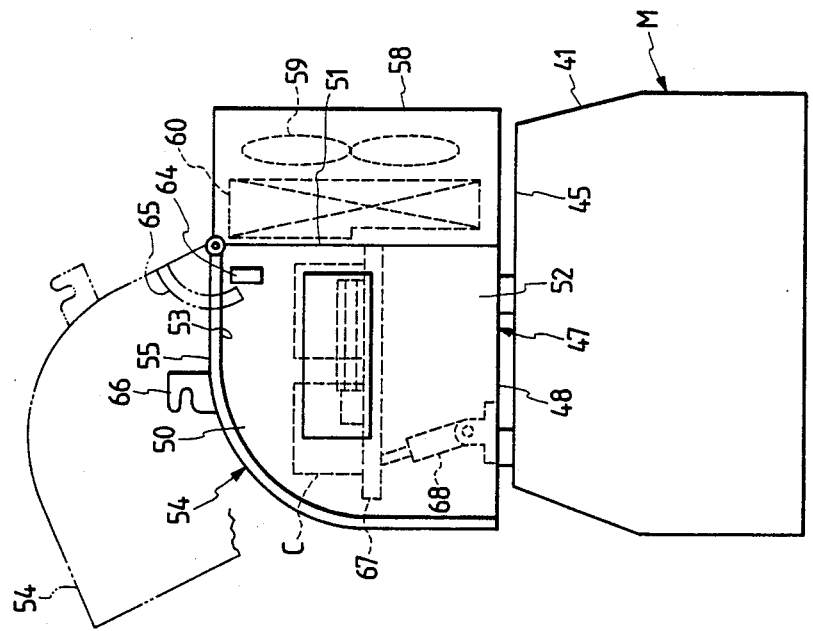
FIG. 7 is a back view showing the robot shown in FIG. 5.
Figure 6:
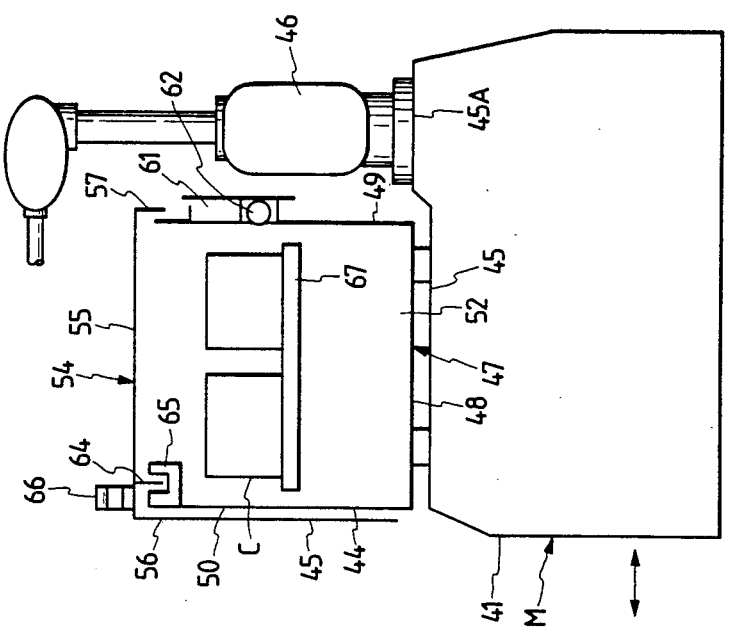
FIG. 6 is a side view showing the robot shown in FIG. 5.

Referring to FIGS. 5 to 7, reference numeral 41 designates a body of a robot wagon M using a battery as drive source. The robot wagon M is provided at the bottom with wheels, a wheel drive mechanism, guide line sensors and mark sensors. It accommodates a drive controller and a running programmer as well as the battery noted above. Its ceiling is covered by a horizontal cover 45. A robot arm 46 having five degrees of freedom is mounted on a front portion 45A of the horizontal cover 45 of the body 41. A transport box 47 is mounted on a rear portion of the horizontal cover 45.

Figure 8:
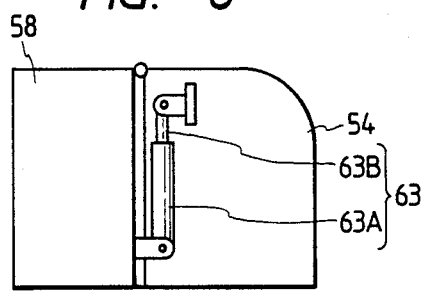
FIGS. 8 and 9 are views showing a switch when a hood is open and when the hood is closed, respectively.
Figure 10:
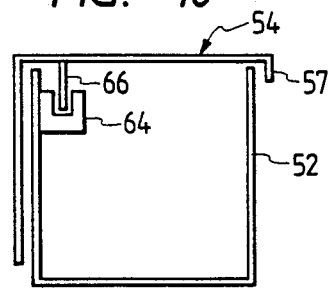
FIGS. 10 and 11 show the hood.
Figure 9:
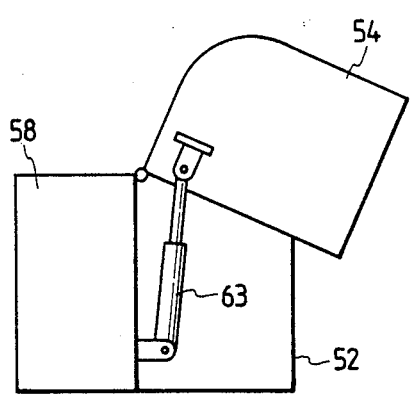
Figure 11:
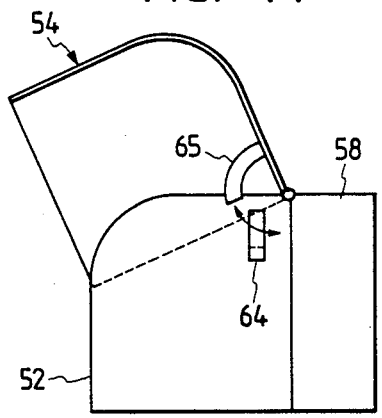
Figure 12:
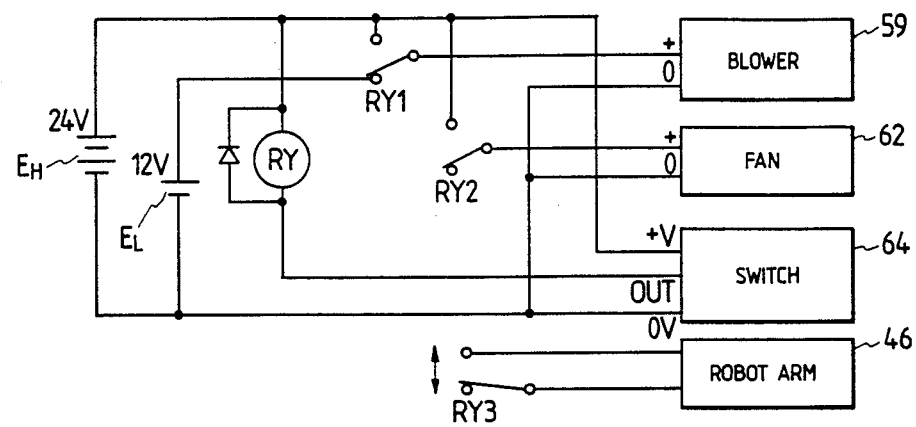
FIG. 12 is a schematic view showing an electric circuit of the transport robot.

The transport box 47 has a body 52 and a hood 54. The body 52 has a bottom wall 48, front and rear side walls 49 and 50 with respect to the running direction of the robot wagon M and a back wall 51 formed with a vent hole 51A. The hood 54 has an opening to cover the body 52, and it has a lid 56 having such a sectional profile as to extend along the edge of the opening 13 of the side wall 49 and a cover portion 56 covering the side wall 50 of the body 52. A strip-like edge portion 57 covering the side wall 49 is hinged to the back wall 51. An air cleaning unit 58 is mounted on the outer side of the back wall 51 of the body 52. The air cleaning unit 58 accommodates a fan 59 and a filter 60. An air curtain unit 61 is provided on the outer surface of the side wall 49 with its air blow-out port up. Reference numeral 62 designates a motor-driven fan of the air curtain unit 61. The hood 54, as shown in FIG. 8 (and shown in an open state in FIG. 9), is coupled to the cleaning unit 58 (or body 52) via a hood opening fixing/releasing mechanism (for instance a one-touch stay) 63. The hood opening fixing/releasing mechanism 63 has a cylinder 63A and a rod 63B. The cylinder 63A has one end rotatably coupled to the air cleaning unit 58, and the rod 63B has one end rotatably coupled to the hood 54. Further, a switch (for instance a U-shaped photoelectric switch) 64 is mounted on the upper end of the inner surface of the side wall 50 of the body 52, and it is driven by a dog 65° mounted on the lid 55 of the hood 54. A detection signal provided from the switch 64 is used as a command for energizing a relay Ry shown in FIG. 12. The relay Ry has relay switches RY1 to RY3. A hood for engaging with a robot arm to be opened and closed is mounted on the top of the hood 54. Of the relay Ry, the relay switch RY1 has a function of switching power supplies $E_H$ and $E_L$ ($<E_H$), and the relay switch RY2 has a function of switching the power supply $E_L$ and zero potential. The relay switch RY3 is provided to inform the robot 46 of the state of the hood 54 (i.e., whether the hood is opened or closed). The power supplies $E_H$ and $E_L$ are taken out from the battery mounted in the wagon. Designated at D is a diode.

The body 41 accommodates a table 67 to support a wafer cassette C (FIG. 13) set thereon. The table 67 has its end on the side of the back wall 51 supported on the back wall 51 via a hinge mechanism and the opposite end supported by a motor-driven cylinder 68.

Now the operation of the robot will be described. It is assumed that the robot wagon M with a wafer cassette C with wafers W transported onto the table 67 in a processing unit of a certain process is driven toward a processing unit of the next process. At this time, the body 52 of the transport box 47 is covered by the hood 54, and the relay switches RY1 to RY3 of the relay Ry are in their state shown in FIG. 12. Air having been cleaned by the filter 60 in the air cleaning unit 58 is supplied to the inside of the body 52 through the vent portion 51A so that the inside of the body 52 is filled with clean air. During this time, the motor-driven fan 62 of the air curtain unit 61 is held inoperative.

Figure 13:
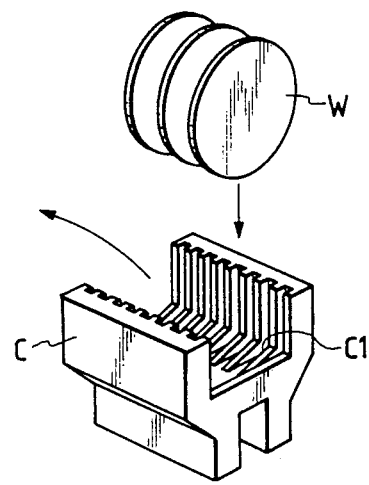
FIG. 13 is a perspective view showing wafers as workpieces and a wafer cassette.

The wafer cassette C is set on the table 67 not in the orientation shown in FIG. 13 but in an orientation obtained as a result of turning down it in the direction of arrow from the illustrated orientation. In this orientation, wafers W are liable to be detached from the wafer cassette C due to vibrations of the robot wagon M being driven. When the wafer cassette C is in a slightly inclined orientation rather than in the horizontal orientation, the wafers W are snugly accommodated in grooves C1 of the wafer cassette C, and their corners are less liable to be broken. Thus, when driving the robot wagon M, the table 67 is tilted by a predetermined angle as shown by dashed lines in FIG. 5 by operating the motor-driven cylinder 68.

When the robot wagon M is stopped at a position corresponding to the processing unit of the next process, the robot arm 46, which is of playback type, commences a preliminarily instructed operation by receiving a command from the running programmer, thus hooking the hood 56 and opening the hood 54 upwards as shown in FIG. 5. The hood 54 is opened upwards by a predetermined angle θ (sufficient to permit operation of the robot arm entering the body 52), and the rod 63B of the hood opening fixing/releasing mechanism 63 is fully extended to secure the rod 63B. At this moment, the switch 64 provides a detection signal.

As a result, the relay Ry is energized, with its switch RY1 switched to the side of the power supply $E_H$ and its switch RY2 switched to the side of the power supply $E_H$. The revolving rate of the fan 59 thus is increased to increase the rate of supply of clean air into the body 52. Further, the relay switch RY3 is closed, and a control circuit (not shown) for controlling the arm 46 detects that the hood 54 is opened and provides a reciprocation command to the motor-driven cylinder 68. The rod of the motor-driven cylinder 68 thus is elongated to bring the table 67 back to the horizontal orientation. Thus, clean air is blown out from the inside of the body 52 toward the opening 53, so that entrance of external air into the body 52 through the opening 53 is prevented. At the same time, the motor-driven fan 62 of the air curtain unit 61 is operated to upwardly blow out air along the side wall 49, thus forming an air curtain covering an opening (robot arm insertion/removal opening) 53A formed between the hood 54 in the open state and side wall 49 at the front to shut out external air so that no external air can enter the body 52.

Subsequently, the robot arm 46 is advanced into the body 52 through the opening 53A, takes out the wafer cassette C from the table 67, brings it to the outside through the opening 53 and transports it to the storage stocker 28 or processing unit 29 through the opening 53.

As shown above, in this embodiment clean air is supplied from the air cleaning unit 58 to the inside of the body 52 during the transport of the object, thus preventing dust from entering the inside of the body and attaching itself to the wafers W.

Further, when the hood 54 is opened, the rate of supply of clean air from the air cleaning unit 58 to the inside of the body 52 is increased, and clean air is strongly blown out to the outside through the opening of the body 52 so as to shut the opening 53A between the hood 54 and side wall 49, through which the robot arm 46 is inserted, with an air curtain, thus preventing dust from entering the body 52 during the transport of the object.

In the above embodiment, the storage stocker 28 and processing unit 29 are provided. The storage stocker 28 is necessary when there occurs a trouble in the processing unit 29, and it is not needed so long as the unit 29 is sound. Further, the partitioning wall 11, which serves to partition the storage stocker 28 and processing unit 29 requiring high cleanliness with respect to the chamber 12 requiring low or medium cleanliness, is not essential, and it may be omitted by providing the housing of the storage stocker 28 or processing unit 29 with filter 19 and hole 27.

Further, the guideways 30 are laid on the floor 8 as mechanism for causing running of the transport robot along them, they are not essential. For example, it is conceivable to provide the robot with light-emitting and light-receiving sections for emitting and receiving invisible light such as infrared rays, provide a robot steering mechanism with a structure responsible to the status of reflection of the rays and automatically determine the direction of progress of the robot by detecting the status of reflection of rays by the storage stocker 28 or processing unit 29 or any separately provided guide post.

We claim:

1. A system for manufacturing semiconductors under clean conditions comprising:

a clean room having a floor, a ceiling and walls, said clean room being provided in a space surrounded by outer walls of a building, said clean room separating said space into a plurality of air circulating paths, said air circulating paths being disposed below, above and on the sides of the clean room;

means for vertically partitioning said clean room into a medium cleanliness room and a high cleanliness room, said medium cleanliness room being cleaner than the space and the high cleanliness room being cleaner than the medium cleanliness room;

first and second filters provided on the ceiling of the medium cleanliness room and the high cleanliness room, respectively, said first and second filters purifying the air flowing from the above air circulating path into the medium cleanliness room and the high cleanliness room;

first and second exhausting openings provided at the floor of the medium cleanliness room and the high cleanliness room respectively for exhausting the air from said medium cleanliness room and said high cleanliness room into the below air circulating path;

a first air-blower provided in the air circulating path on the side of said clean room;

a third filter provided on a boundary between the air circulating path on the side of the clean room and the below air circulating path;

a processing unit in the high cleanliness room;

transport means for transporting workpieces comprising a robot having an accomodating carrier for avoiding dust and holding the workpieces and having a robot arm for moving said workpieces, which is disposed movably in the medium cleanliness room;

a fourth filter provided on the ceiling of the accommodating carrier avoiding the dust, said fourth filter purifying the air flowing from the medium cleanliness room into said accommodating carrier; and communicating means to communicate between said medium cleanliness room and said high cleanliness room wherein said communicating means comprises an opening in said partitioning means for use of the robot arm through which a workpiece is transported to and from between the accommodating carrier and the processing unit.

2. A system as claimed in claim 1, wherein said first and second filters each have a mesh size, the mesh size of the filters of the medium cleanliness room and the high cleanliness room, respectively, being different from each other.

3. A system as claimed in claim 1 wherein the clean room is further partitioned by said vertical partitioning means forming a highest cleanliness room, disposed within the high cleanliness room and between the high cleanliness room and the medium cleanliness room accommodating workstations and further comprising a fifth filter provided on an upper part of the highest cleanliness room and a third exhausting opening provided at a lower part of the highest cleanliness room so as to circulate the air of the high cleanliness room by means of a second air blower to the highest cleanliness room.

4. A system as claimed in claim 2, wherein the clean room is further partitioned by said vertical partitioning means forming a highest cleanliness room disposed within the high cleanliness room and between the high cleanliness room and the medium cleanliness room accommodating workstations and further comprising a fifth filter provided on an upper part of the highest cleanliness room and a third exhausting opening provided at a lower part of the highest cleanliness room so as to circulate the air of the high cleanliness room by means of a second air blower to the highest cleanliness room.

* * * * *